US011263952B2

(12) United States Patent
Wang et al.

(10) Patent No.: US 11,263,952 B2
(45) Date of Patent: Mar. 1, 2022

(54) SHIFT REGISTER UNIT, SHIFT REGISTER AND DRIVING METHOD, AND DISPLAY APPARATUS

(71) Applicants: BEIJING BOE DISPLAY TECHNOLOGY CO., LTD., Beijing (CN); BOE TECHNOLOGY GROUP CO., LTD., Beijing (CN)

(72) Inventors: Xiao Wang, Beijing (CN); Yu Ma, Beijing (CN); Yan Yan, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 368 days.

(21) Appl. No.: 16/475,088

(22) PCT Filed: Dec. 27, 2018

(86) PCT No.: PCT/CN2018/124283
§ 371 (c)(1),
(2) Date: Jun. 29, 2019

(87) PCT Pub. No.: WO2019/237716
PCT Pub. Date: Dec. 19, 2019

(65) Prior Publication Data
US 2021/0343224 A1 Nov. 4, 2021

(30) Foreign Application Priority Data
Jun. 15, 2018 (CN) .......................... 201810620538.0

(51) Int. Cl.
G09G 3/20 (2006.01)
G06F 3/041 (2006.01)

(52) U.S. Cl.
CPC ......... *G09G 3/2092* (2013.01); *G06F 3/0412* (2013.01); *G06F 3/0416* (2013.01);
(Continued)

(58) Field of Classification Search
CPC ......... G09G 2310/0286; G09G 3/2092; G09G 2310/08; G09G 2300/0426; G09G 2310/0294; G06F 3/0412; G06F 3/0416
See application file for complete search history.

(56) References Cited

U.S. PATENT DOCUMENTS 9,824,659 B2 11/2017 Gu et al.
9,916,039 B2 3/2018 Gu et al.
(Continued)

FOREIGN PATENT DOCUMENTS

CN 106356015 B * 1/2017 ............... G09G 3/20

OTHER PUBLICATIONS

International Search Report in Application No. PCT/CN2018/124283, dated Apr. 8, 2019.

*Primary Examiner* — Hong Zhou
(74) *Attorney, Agent, or Firm* — Syncoda LLC; Feng Ma

(57) ABSTRACT

A shift register unit includes a shift register circuit and a control circuit. The control circuit is electrically coupled to the shift register circuit and at least one control terminal, and is configured, based on at least one control signal respectively from the at least one control terminal, to output a hold signal to a pull-up node in the shift register circuit such that a high voltage maintains at the pull-up node during a specified time period. The shift register includes a plurality of shift register circuits cascadedly connected in stages, includes a first shift register circuit, which is coupled with a control circuit to form a shift register unit described above. The above shift register can be used in an array substrate in a display apparatus with touch control functionality.

16 Claims, 9 Drawing Sheets

(52) U.S. Cl.
CPC .............. *G09G 2300/0426* (2013.01); *G09G 2310/0286* (2013.01); *G09G 2310/0294* (2013.01); *G09G 2310/08* (2013.01)

(56) References Cited

U.S. PATENT DOCUMENTS

| | | | |
|---|---|---|---|
| 2017/0108989 A1* | 4/2017 | Gu | ...................... G06F 3/04184 |
| 2017/0199617 A1* | 7/2017 | Gu | ...................... G06F 3/04184 |
| 2017/0221441 A1* | 8/2017 | Gu | ........................ G09G 3/3677 |
| 2018/0046311 A1* | 2/2018 | Gu | ...................... G06F 3/04184 |
| 2018/0293924 A1* | 10/2018 | Wang | ....................... G09G 3/20 |

* cited by examiner

SHIFT REGISTER UNIT, SHIFT REGISTER AND DRIVING METHOD, AND DISPLAY APPARATUS

CROSS-REFERENCE TO RELATED APPLICATION

The present application claims priority to Chinese Patent Application No. 201810620538.0 filed on Jun. 15, 2018, the disclosure of which is hereby incorporated by reference in its entirety.

TECHNICAL FIELD

The present disclosure relates generally to a field of display technologies, and specifically to a shift register unit, a shift register and its driving method, an array substrate, and a display apparatus.

BACKGROUND

With the rapid development of technologies, especially the display technologies, a variety of display devices with touch functionality are continuously emerging, which have greatly enriched people's work and life.

In a typical touch control display panel based on existing display technologies, a touch control functionality is commonly embedded into pixels of a liquid crystal display (LCD) panel, allowing a touch control panel to be integrated with the LCD display panel to thereby form a touch control display panel. This type of touch control display panel has advantages such as high-level integration, light weight, low cost, low power consumption, high picture quality, and multi-point touch control, etc.

In the above mentioned touch control display panel, a plurality of shift register units that are cascadedly connected substantially form a shift register (also known as a gate electrode drive circuit). Each of these cascadedly connected shift register units is configured to output a gate scanning signal to a gate electrode that is electrically connected thereto, so as to control the display of a corresponding pixel.

In the above touch control display panel, because the functionality of touch control and the functionality of display can work independently from each other, it is possible to provide touch control signals in the time intervals between driving the adjacent two-stage shift register units to output the gate scanning signals.

SUMMARY

In a first aspect, the present disclosure provides a shift register unit.

The shift register unit includes a shift register circuit and a control circuit. The control circuit is electrically coupled to the shift register circuit and at least one control terminal, and the control circuit is configured, based on at least one control signal respectively from the at least one control terminal, to output a hold signal to a pull-up node in the shift register circuit such that a high voltage maintains at the pull-up node during a specified time period.

According to some embodiments of the shift register unit, the at least one control terminal can comprise a first control terminal, a second control terminal, and a third control terminal. The control circuit comprises a first transistor, a second transistor, and a third transistor.

Herein, it is configured such that a control electrode and a first electrode of the first transistor are both electrically connected to the second control terminal; a second electrode of the first transistor is electrically connected to a first electrode of the second transistor; a control electrode of the second transistor is electrically connected to the first control terminal; a second electrode of the second transistor is electrically connected to the pull-up node; a control electrode and a first electrode of the third transistor are electrically connected with the third control terminal; and a second electrode of the third transistor is electrically connected to the first electrode of the second transistor.

According to some embodiments of the shift register unit, the control circuit is electrically coupled to a first control terminal, a second control terminal and a third control terminal. The control circuit comprises a fourth transistor, a fifth transistor, a sixth transistor and a seventh transistor.

Herein, it is configured such that a control electrode and a first electrode of the fourth transistor are both electrically connected to the second control terminal; a second electrode of the fourth transistor is electrically connected to a first electrode of the fifth transistor; a control electrode of the fifth transistor is electrically connected to the first control terminal; a second electrode of the fifth transistor is electrically connected to the pull-up node; a control electrode and a first electrode of the sixth transistor are both electrically connected with the third control terminal; a second electrode of the sixth transistor is electrically connected with a first electrode of the seventh transistor; a control electrode of the seventh transistor is coupled to the first control terminal; and a second electrode of the seventh transistor is electrically connected to the pull-up node.

According to some embodiments of the shift register unit, at least one of the second control terminal and the third control terminal is not coupled to the shift register circuit.

According to some other embodiments of the shift register unit, each of the second control terminal and the third control terminal is coupled to the shift register circuit.

Herein, further optionally, the shift register circuit is configured to alternately control a voltage at each of at least one pull-down node based on a second control signal from the second control terminal and a third control signal from the third control terminal.

According to some embodiments, each of the second control signal and the third control signal is an AC signal, and the second control signal and the third second control signal are opposite to each other.

In the shift register unit, the control circuit can be electrically coupled to a first control terminal and a second control terminal, and the control circuit can comprise an eighth transistor and a ninth transistor.

Herein, it is configured such that a control electrode and a first electrode of the eighth transistor are both electrically connected to the second control terminal; a second electrode of the eighth transistor is electrically connected to a first electrode of the ninth transistor; a control electrode of the ninth transistor is electrically connected to the first control terminal; and a second electrode of the ninth transistor is electrically connected to the pull-up node.

In the shift register unit, the control circuit can be electrically coupled to a first control terminal, and the control circuit can accordingly comprise a tenth transistor. A control electrode and a first electrode of the tenth transistor are both electrically connected to the first control terminal; and a second electrode of the tenth transistor is electrically connected to the pull-up node.

In a second aspect, the present disclosure further provides a shift register, which comprises a plurality of shift register circuits that are cascadedly connected in stages.

The plurality of shift register circuits can comprise a first shift register circuit, which is coupled with a control circuit to thereby form a shift register unit according to any one of the embodiments as described above.

In a third aspect, the present disclosure further provides a display apparatus.

The display apparatus includes an array substrate, and the array substrate comprises a shift register according to the shift register as described above.

According to some embodiments, the display apparatus has a touch control functionality independent from a display functionality, and the specified time period is a time period for touch control signals.

In a fourth aspect, the present disclosure further provides a method for driving a shift register. The method comprises a step of:

providing the at least one control signal respectively to the at least one control terminal in the shift register unit such that the control circuit outputs the hold signal to the pull-up node in the first shift register circuit in the shift register unit during a specified time period.

According to some embodiments, the specified time period is before the first shift register circuit outputs a first scanning signal and after a shift register circuit at a stage immediately upstream of the first shift register circuit outputs a second scanning signal.

According to some embodiments of the method, the shift register unit is based on one of the embodiment described above, and as such, the step of providing the at least one control signal respectively to the at least one control terminal in the shift register unit comprises:

providing a high-voltage first control signal, a second control signal, and a third control signal respectively to the first control terminal, the second control terminal and the third control terminal.

According to some other embodiments of the method, the shift register unit is based on another embodiment described above, and as such, the step of providing the at least one control signal respectively to the at least one control terminal in the shift register unit comprises:

providing a high-voltage first control signal to the first control terminal.

According to yet some other embodiments of the method, the shift register unit is based on yet another embodiment described above, and as such, the step of providing the at least one control signal respectively to the at least one control terminal in the shift register unit comprises:

providing a high-voltage first control signal and a high-voltage second control signal respectively to the first control terminal and the second control terminal.

According to yet some other embodiments of the method, the shift register unit is based on yet another embodiment described above, and as such, the step of providing the at least one control signal respectively to the at least one control terminal in the shift register unit comprises:

providing a high-voltage first control signal to the first control terminal.

BRIEF DESCRIPTION OF DRAWINGS

To more clearly illustrate some of the embodiments, the following is a brief description of the drawings. The drawings in the following descriptions are only illustrative of some embodiments. For those of ordinary skill in the art, other drawings of other embodiments can become apparent based on these drawings.

DETAILED DESCRIPTION

In the following, with reference to the drawings of the embodiments disclosed herein, the technical solutions of the embodiments of the invention will be described in a clear and fully understandable way. It is noted that the described embodiments are merely a portion but not all of the embodiments of the invention. Based on the described embodiments of the invention, those ordinarily skilled in the art can obtain other embodiment(s), which come(s) within the scope sought for protection by the invention.

Unless otherwise defined, all terms used throughout the disclosure, including technical and scientific terms, have the same meaning as those commonly understood by people of ordinary skills in the field. It is further understood that terms such as those defined in dictionaries shall be interpreted as having meanings that are consistent with the context of the specification and with related technologies as well, and shall not be interpreted only in an ideal or formal manner unless otherwise explicitly defined herein.

Throughout the disclosure, the terms "connect," "connected," "couple," "coupled," and alike, which specify that two or more parts are "connected" or "coupled" to one another can be interpreted that these two or more parts are directly connected or coupled to one another, or can be interpreted that these two or more parts are connected or coupled to one another through one or more intermediate parts.

Furthermore, in all of the embodiments throughout the disclosure, because the source electrode and the drain electrode of any transistor are symmetrical, and the directions of the conductance current between the source electrode and the drain electrode of an N-type transistor and a P-type transistor are opposite, the end of a transistor under control is referred to as a control terminal, the signal input terminal is referred to as a first terminal, and the signal output terminal is referred to as the second terminal.

Figure 1:
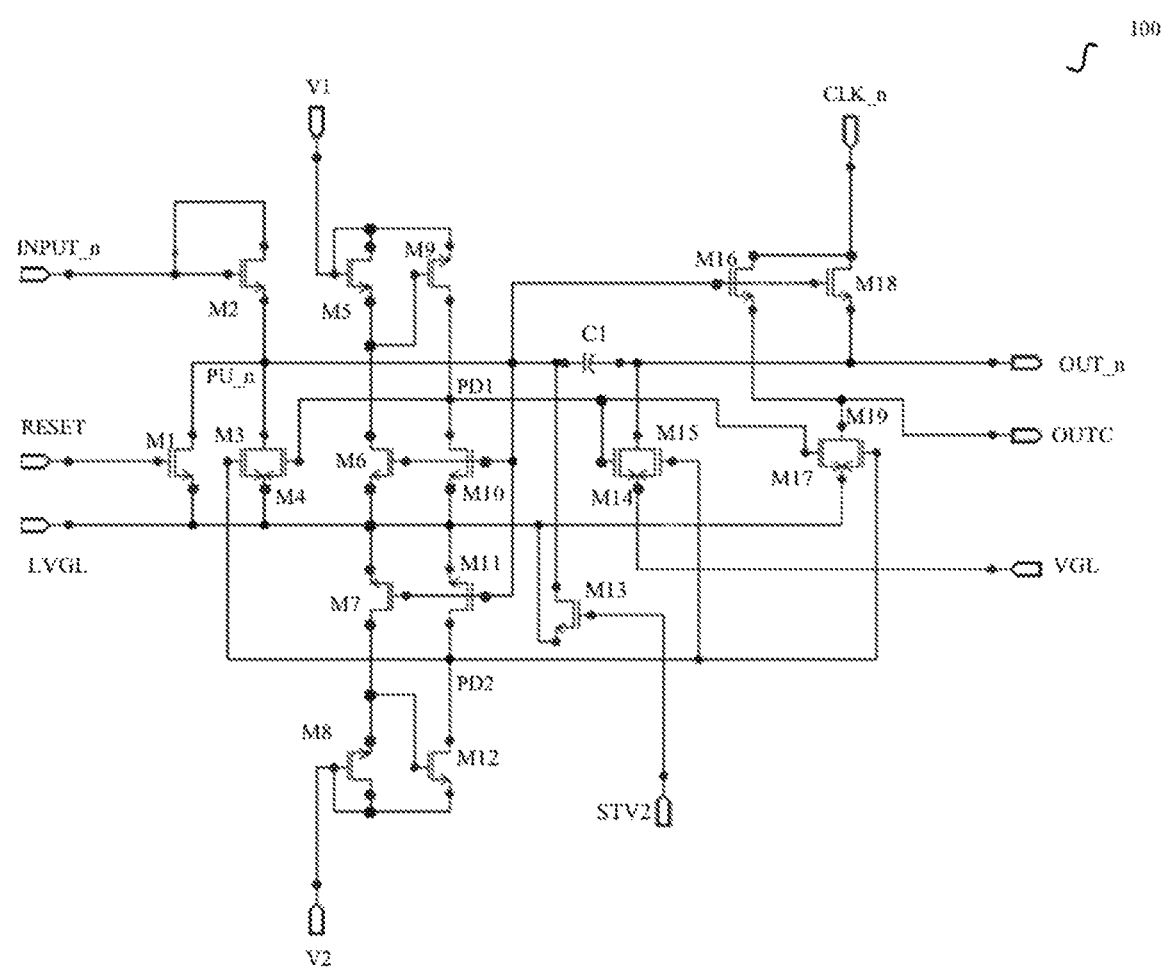
FIG. 1 is a circuit diagram illustrating a shift register circuit according to an existing technology.

FIG. 1 is a circuit diagram illustrating a shift register circuit according to an existing technology. The shift register circuit comprises a plurality of transistors (i.e. M1-M19) and a capacitor C1. The shift register circuit is further electrically coupled to a plurality of signal terminals, including a first AC signal terminal V1, a second AC signal terminal V2, a reset signal terminal RESET, a clock signal terminal CLK_n, a signal input terminal INPUT_n, a signal output terminal OUT_n, and several other terminals such as LVGL, VGL, STV2, and OUTC. The electrical connections among these electrical components (i.e. the transistors M1-M19 and the capacitor C1) and the signal terminals are illustrated by the circuit diagram shown in FIG. 1.

Before the shift register circuit 100 starts to work, the voltage of a pull-up node PU_n can be reset by a reset signal from the reset signal terminal RESET. At this time, by controlling the voltage at the pull-down nodes (PD1 and PD2), the noise voltages on the pull-up nodes PU_n can be reduced. In order to reduce the influence of the direct current (DC) bias on the thin film transistors, the shift register circuit 100 controls the voltage at the pull-down nodes (PD1 and PD2) by means of a pair of alternate current (AC) signals (i.e. a first AC signal and a second AC signal), from the first AC signal terminal V1 and the second AC signal terminal V2, respectively. The pair of the AC signals (i.e. the first AC signal and the second AC signal) are configured to be opposite to each other.

With further reference to FIG. 1, the signal input terminal INPUT_n of the shift register circuit 100 is substantially electrically connected to the signal output terminal OUT_n−1 of an immediate upper-stage shift register circuit (i.e. a shift register circuit that is one stage upstream of said shift register circuit 100, not shown in FIG. 1), and thus an input signal from the signal input terminal INPUT_n of the shift register circuit 100 is substantially an output signal from the signal output terminal OUT_n−1 of the immediate upper-stage shift register circuit.

The shift register circuit 100 controls that the pull-up node PU_n is at a high voltage when the input signal from the signal input terminal INPUT_n is a high voltage. When the pull-up node PU_n is at a high voltage, the electrical connection between a clock signal terminal CLK_n and a signal output terminal OUT_n can be established. As such, the shift register circuit 100 can output a scanning signal from the signal output terminal OUT_n based on the clock signal from the clock signal terminal CLK_n.

In the embodiments of the shift register circuit 100 shown in FIG. 1, N-type transistors are used, and as known by people of ordinary skills in the art, P-type transistors can alternatively be used as well.

Figure 2:
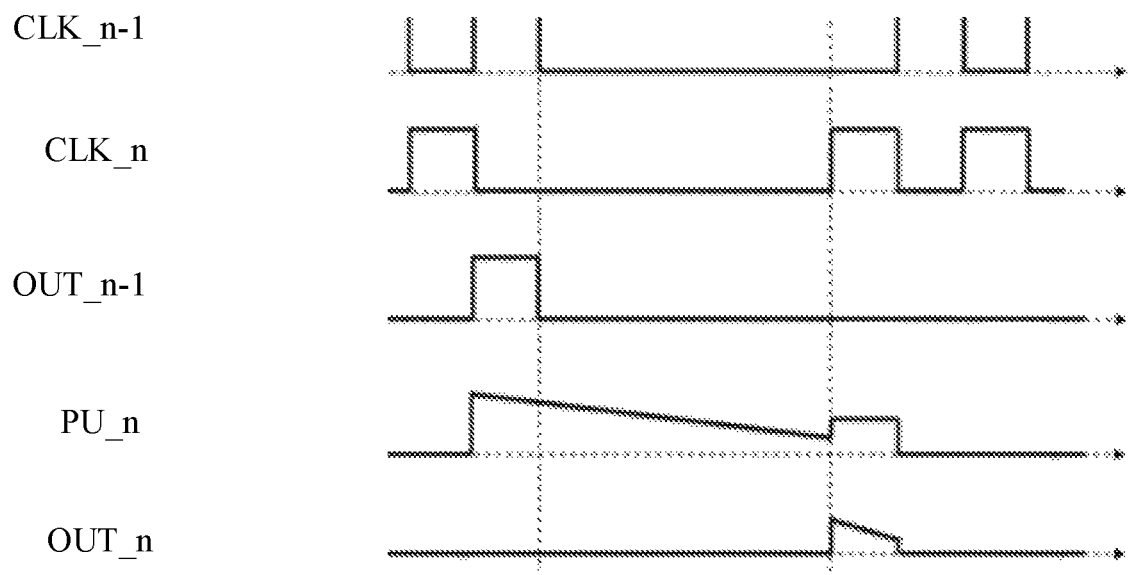
FIG. 2 illustrates a time sequence diagram of signals for the shift register circuit shown in FIG. 1.

FIG. 2 illustrates a time sequence diagram of signals for the shift register circuit shown in FIG. 1. Herein the shift register circuit can be employed in a touch control display panel where the touch control functionality and the display functionality are separated or independent from each other.

With reference to FIG. 2, a time-sequence clock signal for the clock signal terminal CLK_n in the shift register circuit, and a time-sequence clock signal for the clock signal terminal CLK_n−1 in the immediate upper-stage shift register circuit are shown. The time period marked as LHB is an effective time period for touch control signals, during which the clock signals from the clock signal terminals CLK_n−1 and CLK_n are not outputted. As further shown in FIG. 2, the touch control signal can be provided in time intervals after the immediate upper-stage shift register circuit 100 outputs a scanning signal from the signal output terminal OUT_n−1 and before the shift register circuit 100 outputs the scanning signal from the signal output terminal OUT_n.

The pull-up node PU_n of the shift register circuit 100 is floating in the effective time period for the touch control signals. With reference to FIG. 2, at high temperatures, the leakage current of a thin film transistor increases, and the high voltage at the pull-up node PU_n is difficult to maintain. As such, during the effective time period for the touch control signal, the voltage at the pull-up node PU_n decreases over time. Any abnormal voltages at the pull-up node PU_n will cause the shift register circuit 100 to output the output signal from the signal output terminal OUT_n abnormally.

In order to address the above issue associated with existing technology, in a first aspect, the present disclosure provides a shift register unit.

The shift register unit substantially comprises a shift register circuit and a control circuit. The control circuit is coupled with the shift register circuit and is configured to maintain a high voltage at a pull-up node of the shift register circuit during a time period for touch control signals.

Figure 3:
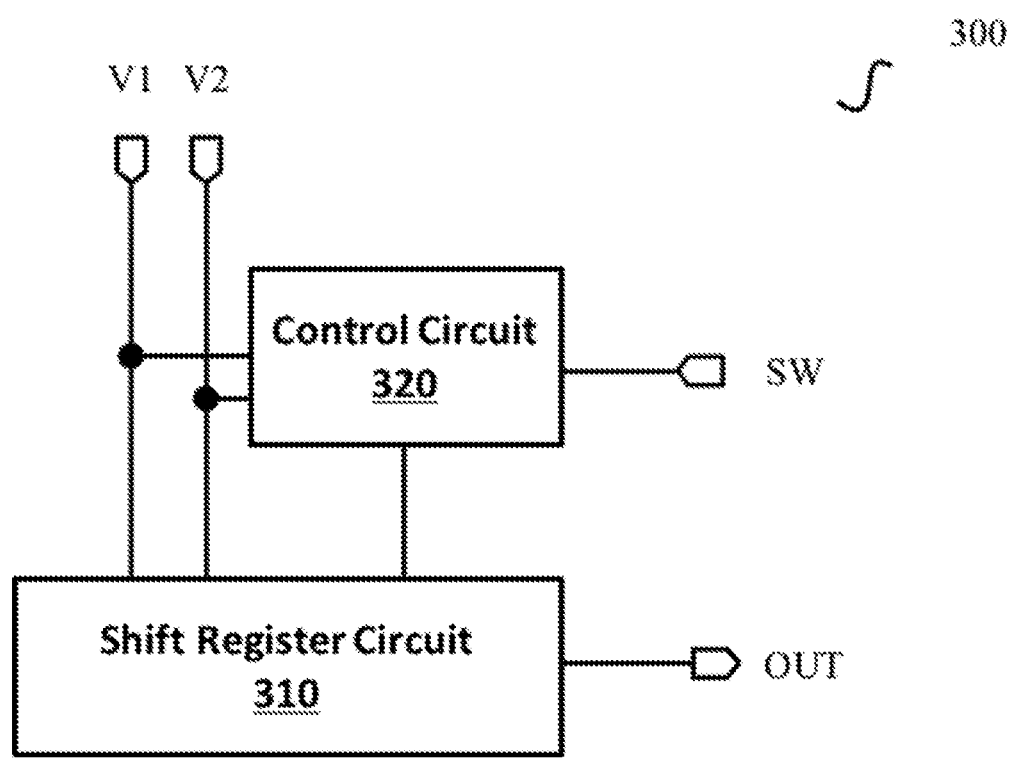
FIG. 3 illustrates a block diagram of a shift register unit according to some embodiments of the disclosure.

FIG. 3 illustrates a block diagram of a shift register unit according to some embodiments of the disclosure. The shift register unit 300 includes a shift register circuit 310 and a control circuit 320.

According to some embodiments, the shift register circuit 310 is configured to alternately control the voltages at the pull-down nodes (PD1, PD2) in the shift register circuit 310 based on a first AC signal from the first AC signal terminal V1 and a second AC signal from the second AC signal terminal V2. Herein, the shift register circuit 310 can be the shift register circuit 100 described above and illustrated in FIG. 1, but can also be other types of a shift register circuit which respectively receives a first AC signal from a first AC signal terminal V1 and a second AC signal from a second AC signal terminal V2.

The control circuit 320 is electrically coupled with the shift register circuit 310, the first AC signal terminal V1, the second AC signal terminal V2, and the first control terminal SW (which is configured to provide a first control signal). The control circuit 320 is configured to output a hold signal to the pull-up node PU_n in the shift register circuit 310 based on the first AC signal from the first AC signal terminal V1, the second AC signal from the second AC signal terminal V2, and the first control signal from the first control terminal SW.

In the above embodiment of the shift register unit, the shift register unit 300 can, during the effective time period for the touch control signals, control the time when the control circuit 320 outputs the hold signal to the pull-up node PU_n by means of the first control signal from the first control terminal SW, so as to maintain the voltage at the pull-up node PU_n.

As such, the influence of voltage dropping at the pull-up node PU_n on the output voltage from the signal output terminal OUT_n of the shift register circuit 310 can be avoided. Furthermore, the shift register unit 300 can use the first AC signal from the first AC signal terminal V1 and the second AC signal from the second AC signal terminal V2 of the shift register circuit 310 as power supplies for the control circuit 320, which in turn can avoid the requirement to configure an additional power supply in the shift register unit, thereby resulting in a cost saving.

Figure 4:
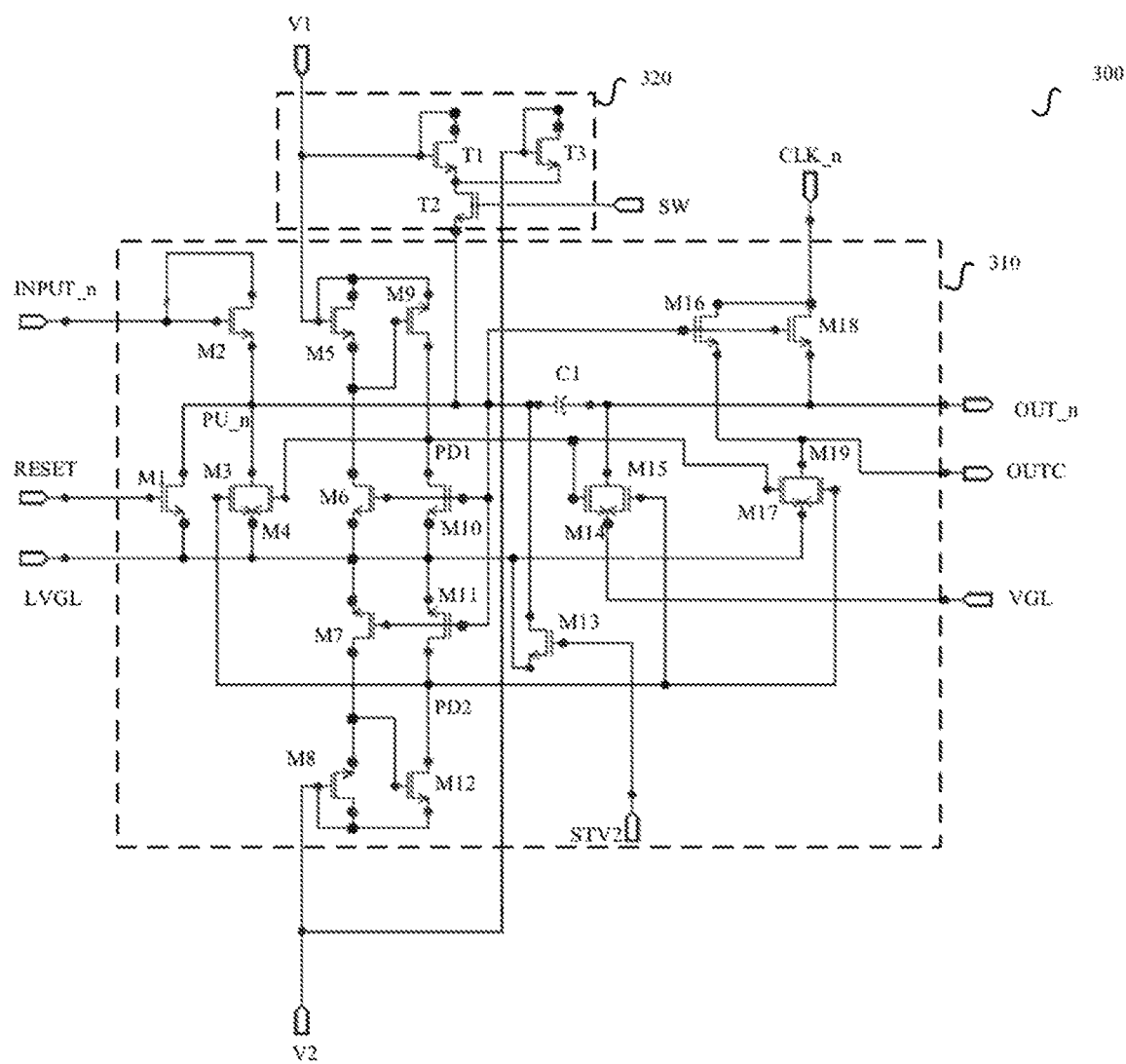
FIG. 4 is a circuit diagram illustrating a shift register unit according to one embodiment of the disclosure.

FIG. 4 is a circuit diagram illustrating a shift register unit according to one embodiment of the disclosure. In the embodiment of the shift register unit shown in FIG. 4, the shift register circuit 310 is substantially the shift register circuit 100 shown in FIG. 1.

It should be understood by those skilled in the art that other types of shift register circuits having a first AC signal terminal V1 for inputting a first AC signal therefrom and a second AC signal terminal V2 for inputting a second AC signal therefrom can also be employed in the shift register unit 300 according to some other embodiments of the present disclosure.

In the embodiment of the shift register unit shown in FIG. 4, the control circuit 320 includes a first transistor T1, a second transistor T2 and a third transistor T3, as indicated by the box with dotted lines.

A control electrode and a first electrode of the first transistor T1 are both electrically connected to the first AC signal terminal V1, and a second electrode of the first transistor T1 is electrically connected to a first electrode of the second transistor T2. A control electrode of the second transistor T2 is electrically connected to the first control terminal SW, and a second electrode of the second transistor T2 is electrically connected to the pull-up node PU_n. A control electrode and a first electrode of the third transistor T3 are electrically connected with the second AC signal terminal V2, and a second electrode of the third transistor T3 is electrically connected to the first electrode of the second transistor T2.

In the embodiments of the shift register unit described herein, the electrical connections between the shift register circuit 310 and the control circuit 320 are as follows.

As shown in the shift register unit illustrated in FIG. 4, the control electrode and the first electrode of the first transistor T1 of the control circuit 320 is electrically connected with, in addition to the first AC signal terminal V1, a control electrode and a first electrode of a transistor (i.e. the fifth transistor M5 shown in the figure) in the shift register circuit 310, as well. In other words, the first AC signal terminal V1 is electrically connected to the control electrode and the first electrode of the first transistor T1 of the control circuit 320, as well as to the control electrode and the first electrode of the fifth transistor M5 of the shift register circuit 310, and is thereby configured to provide the first AC signal to both the shift register circuit 310 and the control circuit 320.

Furthermore, the control electrode and the first electrode of the third transistor T3 are electrically connected with, in addition to the second AC signal terminal V2, a control electrode and a first electrode of a transistor (i.e. the eighth transistor M8 shown in the figure) in the shift register circuit 310, as well. In other words, the second AC signal terminal V2 is electrically connected to the control electrode and the first electrode of the third transistor T3 of the control circuit 320, as well as to the control electrode and the first electrode of the eighth transistor M8 of the shift register circuit 310, and is thereby configured to provide the second AC signal to both the shift register circuit 310 and the control circuit 320.

It is noted that the shift register circuit 310 in FIG. 4, which has essentially same circuit structure of the shift register unit shown in FIG. 1, shall not be interpreted as a limitation to the scope of the disclosure, and a shift register circuit having a similar function as the one shown in FIG. 1, can alternatively be included in the shift register unit 300.

Figure 5:
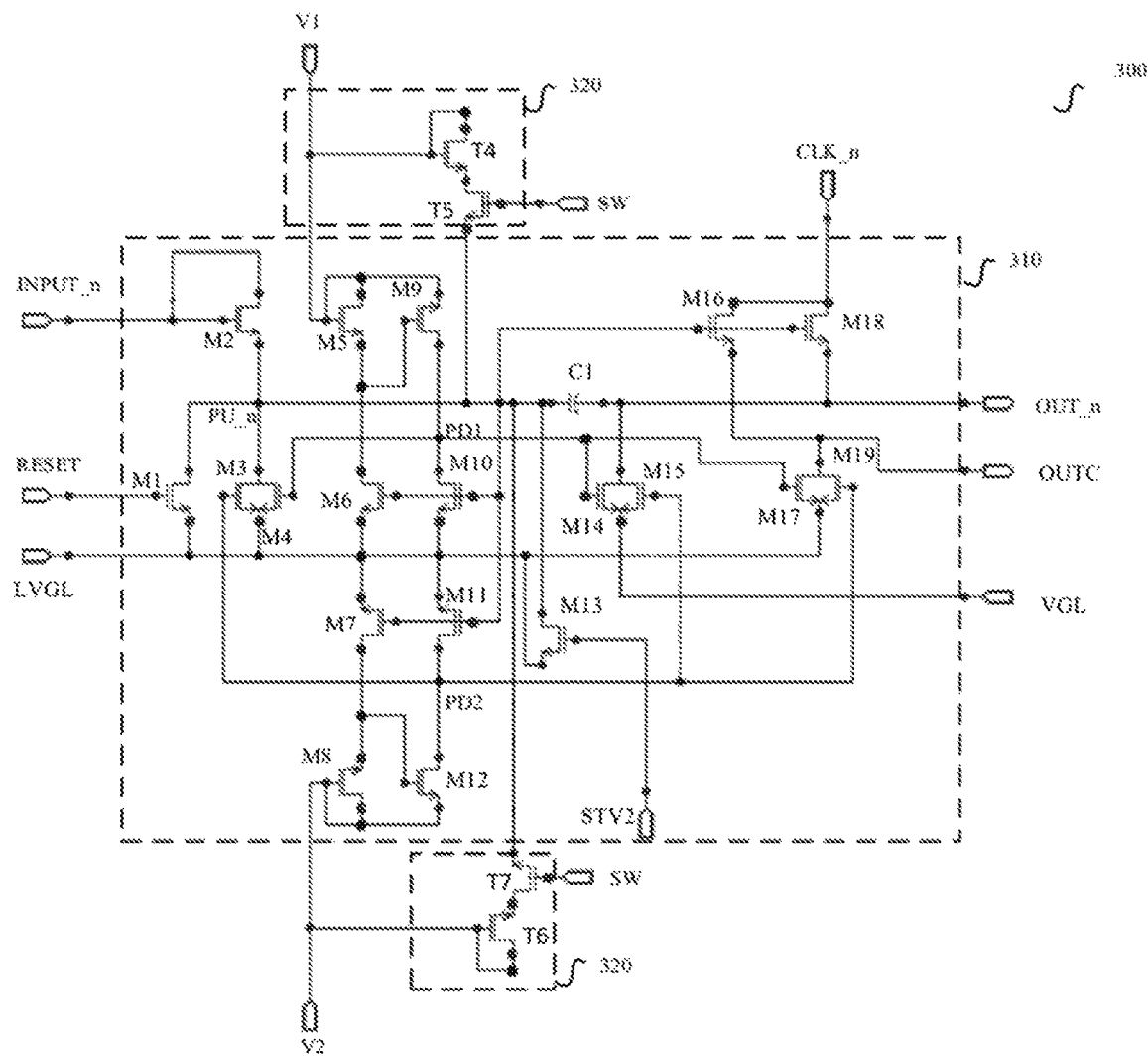
FIG. 5 is a circuit diagram illustrating a shift register unit according to another embodiment of the disclosure.

FIG. 5 is a circuit diagram illustrating a shift register unit according to another embodiment of the disclosure. In the shift register unit shown in FIG. 5, the control circuit 320 includes a fourth transistor T4, a fifth transistor T5, a sixth transistor T6, and a seventh transistor T7.

A control electrode and a first electrode of the fourth transistor T4 are both electrically connected to the first AC signal terminal V1, and a second electrode of the fourth transistor T4 is electrically connected to a first electrode of the fifth transistor T5. A control electrode of the fifth transistor T5 is electrically connected to the first control terminal SW, and a second electrode of the fifth transistor T5 is electrically connected to the pull-up node PU_n. A control electrode and a first electrode of the sixth transistor T6 are both electrically connected with the second AC signal terminal V2, and a second electrode of the sixth transistor T6 is electrically connected with a first electrode of the seventh transistor T7. A control electrode of the seventh transistor T7 is coupled to the first control terminal SW, and a second electrode of the seventh transistor T7 is electrically connected to the pull-up node PU_n.

In the embodiments of the shift register unit described herein, the electrical connections between the shift register circuit 310 and the control circuit 320 are as follows.

As shown in the shift register unit illustrated in FIG. 5, the control electrode and the first electrode of the fourth transistor T4 of the control circuit 320 is electrically connected with, in addition to the first AC signal terminal V1, a control electrode and a first electrode of a transistor (i.e. the fifth transistor M5 shown in the figure) in the shift register circuit 310, as well. In other words, the first AC signal terminal V1 is electrically connected to the control electrode and the first electrode of the fourth transistor T4 of the control circuit 320, as well as to the control electrode and the first electrode of the fifth transistor M5 of the shift register circuit 310, and is thereby configured to provide the first AC signal to both the shift register circuit 310 and the control circuit 320.

Furthermore, the control electrode and the first electrode of the sixth transistor T6 are electrically connected with, in addition to the second AC signal terminal V2, a control electrode and a first electrode of a transistor (i.e. the eighth transistor M8 shown in the figure) in the shift register circuit 310, as well. In other words, the second AC signal terminal V2 is electrically connected to the control electrode and the first electrode of the sixth transistor T6 of the control circuit 320, as well as to the control electrode and the first electrode of the eighth transistor M8 of the shift register circuit 310, and is thereby configured to provide the second AC signal to both the shift register circuit 310 and the control circuit 320.

It is noted that the shift register circuit 310 in FIG. 5, which has substantially same circuit structure of the shift register unit shown in FIG. 1, shall not be interpreted as a limitation to the scope of the disclosure, and a shift register circuit having a similar function as the one shown in FIG. 1, can alternatively be included in the shift register unit 300.

Figure 6:
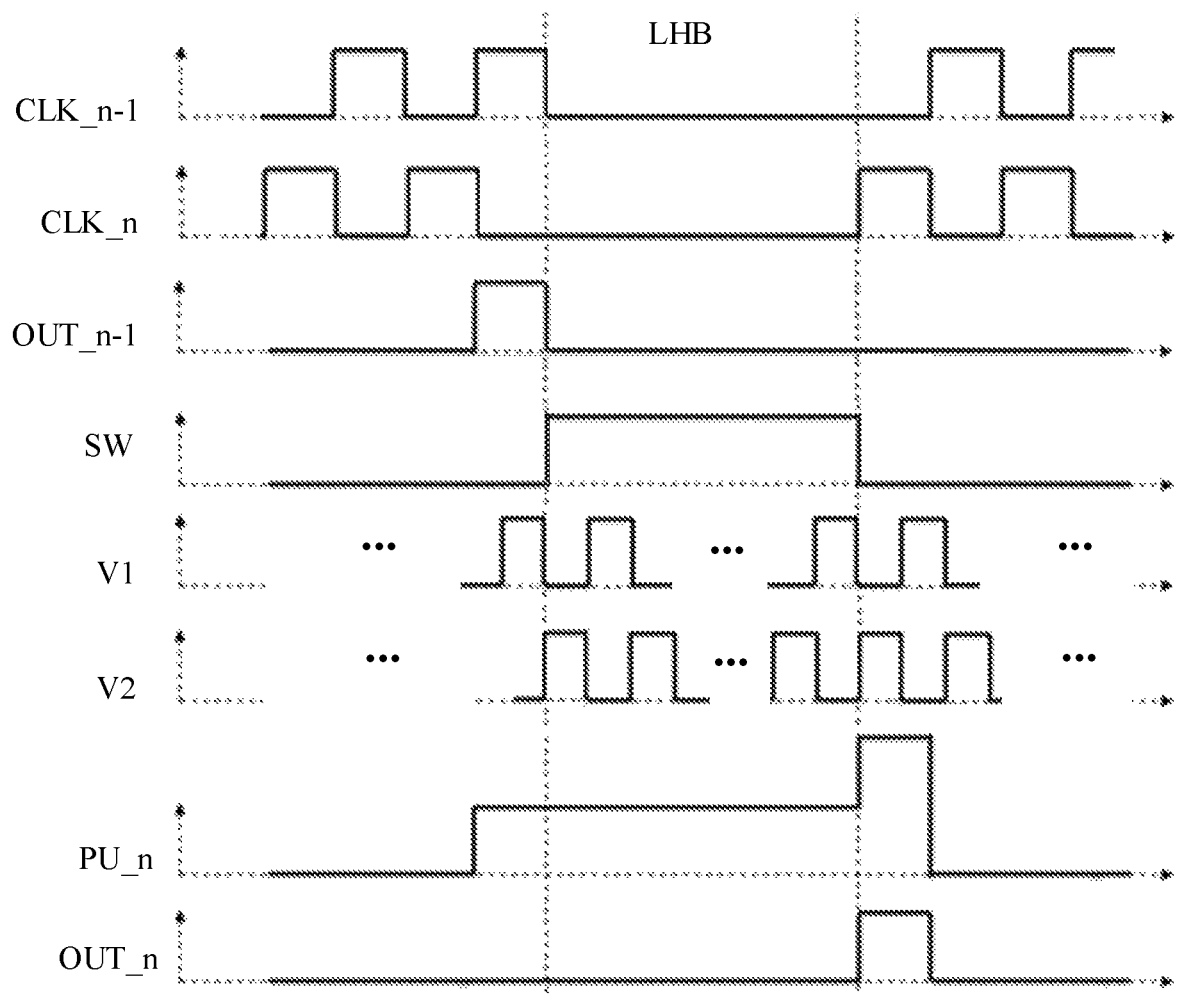
FIG. 6 illustrates a time sequence diagram of signals for the shift register unit shown in FIG. 4 or FIG. 5.

FIG. 6 illustrates a time sequence diagram of signals for the shift register unit shown in FIG. 4 or FIG. 5. In the description below, all transistors in the embodiments shown in FIG. 4 or FIG. 5 are N-type transistors.

In the following, with reference to FIG. 4, the process for controlling the embodiment of the shift register unit 300 illustrated in FIG. 4 is described in detail.

During the effective time period for the touch control signals (i.e. the time period marked as LHB in FIG. 6), the first control signal from the first control terminal SW is a high voltage, which controls that the second transistor T2 is on.

When the first AC signal from the first AC signal terminal V1 is a high voltage, the first transistor T1 is on. As such, the high-voltage first AC signal from the first AC signal terminal V1 is then provided to the pull-up node PU_n. At the same time, the second AC signal from the second AC signal terminal V2 is a low voltage, so the third transistor T3 is off. Therefore, the second AC signal from the second AC signal terminal V2 does not affect the voltage at the pull-up node PU_n.

When the second AC signal from the second AC signal terminal V2 is a high voltage, the third transistor T3 is on. The high-voltage second AC signal from the second AC signal terminal V2 is then provided to the pull-up node PU_n. At the same time, the first AC signal from the first AC signal terminal V1 is a low voltage, so the first transistor T1 is off. Therefore, the first AC signal from the first AC signal terminal V1 does not affect the voltage at the pull-up node PU_n.

Taken together, during this effective time period for the touch control signals (i.e. LHB), the first AC signal from the first AC signal terminal V1 and the second AC signal from the second AC signal terminal V2 can alternately provide a high voltage to the pull-up node PU_n.

During the working period for the shift register circuit 310 (i.e. all other time periods except the period marked LHB in FIG. 6), the first control signal from the first control terminal SW is a low voltage, the second transistor T2 is off. Thus, neither the first AC signal from the first AC signal terminal V1 nor the second AC signal from the second AC signal terminal V2 affects the voltage at the pull-up node PU_n through the control circuit 320. Therefore, in this period of time, the control circuit 320 does not affect the shift register functionality of the shift register circuit 310.

In the following, with reference to FIG. 5, the process for controlling the embodiment of the shift register unit 300 illustrated in FIG. 5 is described in detail.

During the effective time period for touch control signals (i.e. the time period marked as LHB in FIG. 6), the first control signal from the first control terminal SW is a high voltage, which controls that the fifth transistor T5 and the seventh transistor T7 are both on.

When the first AC signal from the first AC signal terminal V1 is a high voltage, the fourth transistor T4 is on. As such, the high-voltage first AC signal from the first AC signal terminal V1 is then provided to the pull-up node PU_n. At the same time, the second AC signal from the second AC signal terminal V2 is a low voltage, so the sixth transistor T6 is off. Therefore, the second AC signal from the second AC signal terminal V2 does not affect the voltage at the pull-up node PU_n.

When the second AC signal from the second AC signal terminal V2 is a high voltage, the sixth transistor T6 is on. The high-voltage second AC signal from the second AC signal terminal V2 is then provided to the pull-up node PU_n. At the same time, the first AC signal from the first AC signal terminal V1 is a low voltage, so the fourth transistor T4 is off. Therefore, the first AC signal from the first AC signal terminal V1 does not affect the voltage at the pull-up node PU_n.

Taken together, during this effective period for touch control signals (i.e. LHB), the first AC signal from the first AC signal terminal V1 and the second AC signal from the second AC signal terminal V2 can alternately provide a high voltage to the pull-up node PU_n.

During the working period for the shift register circuit 310 (i.e. all other time periods except the period marked LHB in FIG. 6), the first control signal from the first control terminal SW is a low voltage, the fifth transistor T5 and the seventh transistor T7 are both off. Thus, neither the first AC signal from the first AC signal terminal V1 nor the second AC signal from the second AC signal terminal V2 affects the voltage at the pull-up node PU_n through the control circuit 320. Therefore, in this period of time, the control circuit 320 does not affect the shift register functionality of the shift register circuit 310.

In the above embodiments of the shift register unit illustrated in FIGS. 3-6, in order to maintain the high voltage at the pull-up node PU_n, the control circuit 320 substantially utilizes the first AC signal and the second AC signal, respectively from the first AC signal terminal V1 and the second AC signal terminal V2, that are also employed by the shift register circuit 310 to alternately control the voltages at the pull-down nodes (PD1, PD2) in the shift register circuit 310. As such, there is no need to arrange other signal terminal(s) for the control circuit 320 to realize the maintenance of a high voltage at the pull-up node PU_n.

It is noted, however, that the control circuit 320 can optionally be coupled to at least one signal terminal that is not coupled to the shift register circuit 310. For example, instead of using the first AC signal terminal V1 and the second AC signal terminal V2 that are also employed in the shift register circuit 310 as in the embodiments described above and illustrated in FIGS. 3-5, according to some embodiment of the shift register unit, the control circuit 320 can optionally be electrically connected to a second control terminal and a third control terminal, which similarly also respectively provide a first AC signal and a second AC signal that are opposite to each other. As such, the control circuit 320 can also provide a hold signal to the pull-up node PU_n during the time period for touch control signals.

It is further noted that here are other embodiments for realizing maintain the high voltage at the pull-up node PU_n.

Figure 7:
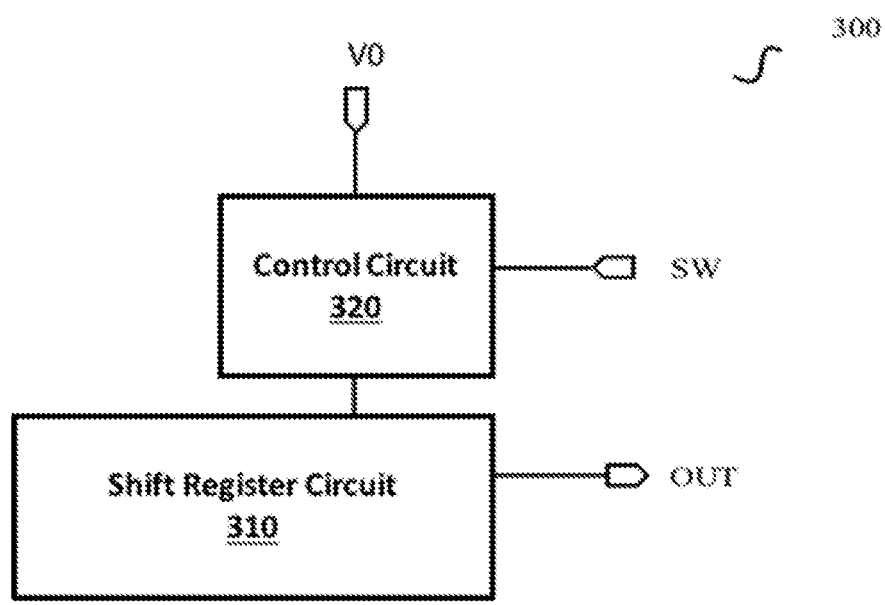
FIG. 7 illustrates a block diagram of a shift register unit according to some other embodiments of the disclosure.

FIG. 7 illustrates a block diagram of a shift register unit according to some other embodiments of the disclosure. As shown in FIG. 7, in addition to the coupling with the shift register circuit 310 and the first control terminal SW, the control circuit is further coupled with a second control terminal V0, which substantially provides a second control signal to the control circuit 320 such that the control circuit 320 can, during the effective time period for the touch control signals, output a hold signal to the pull-up node PU_n in the shift register circuit 310 based on the first control signal from the first control terminal SW and the second control signal form the second control terminal V0.

Figure 8:
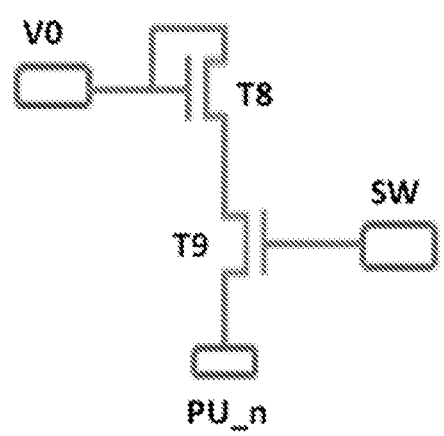
FIG. 8 illustrates a circuit diagram of a control circuit in the shift register unit shown in FIG. 7 according to some embodiments of the disclosure.

FIG. 8 illustrates a circuit diagram of a control circuit in the shift register unit shown in FIG. 7 according to some embodiments of the disclosure. As shown in the figure, the control circuit 320 comprises an eighth transistor T8 and a ninth transistor T9.

A control electrode and a first electrode of the eighth transistor T8 are both electrically connected to the second control terminal V0, and a second electrode of the eighth transistor T8 is electrically connected to a first electrode of the ninth transistor T9. A control electrode of the ninth transistor T9 is electrically connected to the first control terminal SW, and a second electrode of the ninth transistor T9 is electrically connected to the pull-up node PU_n.

Similar to the embodiments of the shift register unit 300 described above and illustrated in FIGS. 3-6, during the effective time period for touch control signals (not shown, yet comparable to the time period marked as LHB in FIG. 6), the first control terminal SW in this embodiment of the shift register unit 300 shown in FIG. 7 is configured to provide only a high voltage (i.e. the first control signal) to the control electrode of the ninth transistor T9, such that the ninth transistor T9 is on. At the same time, the second control signal from the second control terminal V0 is a high voltage, thus the eighth transistor T8 is on. As such, the high-voltage second control signal from the second control terminal V0 is then provided to the pull-up node PU_n.

During the working period for the shift register circuit 310 (not shown, yet comparable to all other time periods except the period marked LHB in FIG. 6), the first control signal from the first control terminal SW is a low voltage, the ninth transistor T9 is off. Thus, the second control signal from the second control terminal V0 will not affect the voltage at the pull-up node PU_n through the control circuit 320. Therefore, in this period of time, the control circuit 320 does not affect the shift register functionality of the shift register circuit 310.

Figure 9:
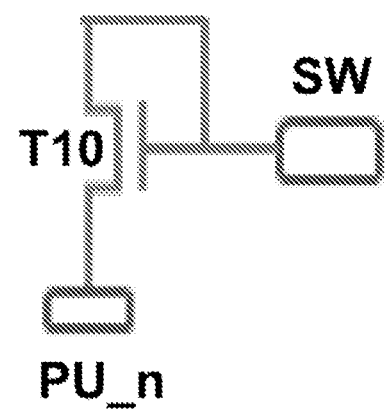
FIG. 9 illustrates a circuit diagram of a control circuit in the shift register unit shown in FIG. 7 according to some other embodiments of the disclosure.

FIG. 9 illustrates a circuit diagram of a control circuit in the shift register unit shown in FIG. 7 according to some other embodiments of the disclosure. As shown in the figure, the control circuit 320 comprises a tenth transistor T10.

A control electrode and a first electrode of the tenth transistor T10 are both electrically connected to the first control terminal SW, and a second electrode of the tenth transistor T10 is electrically connected to the pull-up node PU_n.

Similar to the above embodiments of the shift register unit 300 described above and illustrated in FIGS. 3-6 and FIGS. 7-18, during the effective time period for touch control signals (not shown, yet comparable to the time period marked as LHB in FIG. 6), the first control terminal SW in this embodiment of the shift register unit 300 shown in FIG. 7 is configured to provide only a high voltage (i.e. the first control signal) to the first terminal and the control electrode of the tenth transistor T10. As such, the high-voltage first control signal from the first control terminal SW can then be provided to the pull-up node PU_n.

During the working period for the shift register circuit 310 (not shown, yet comparable to all other time periods except the period marked LHB in FIG. 6), the first control signal from the first control terminal SW is a low voltage, the tenth transistor T10 is off. Thus, in this period of time, the control circuit 320 does not affect the shift register functionality of the shift register circuit 310.

In a third aspect, the present disclosure further provides a shift register.

Figure 10:
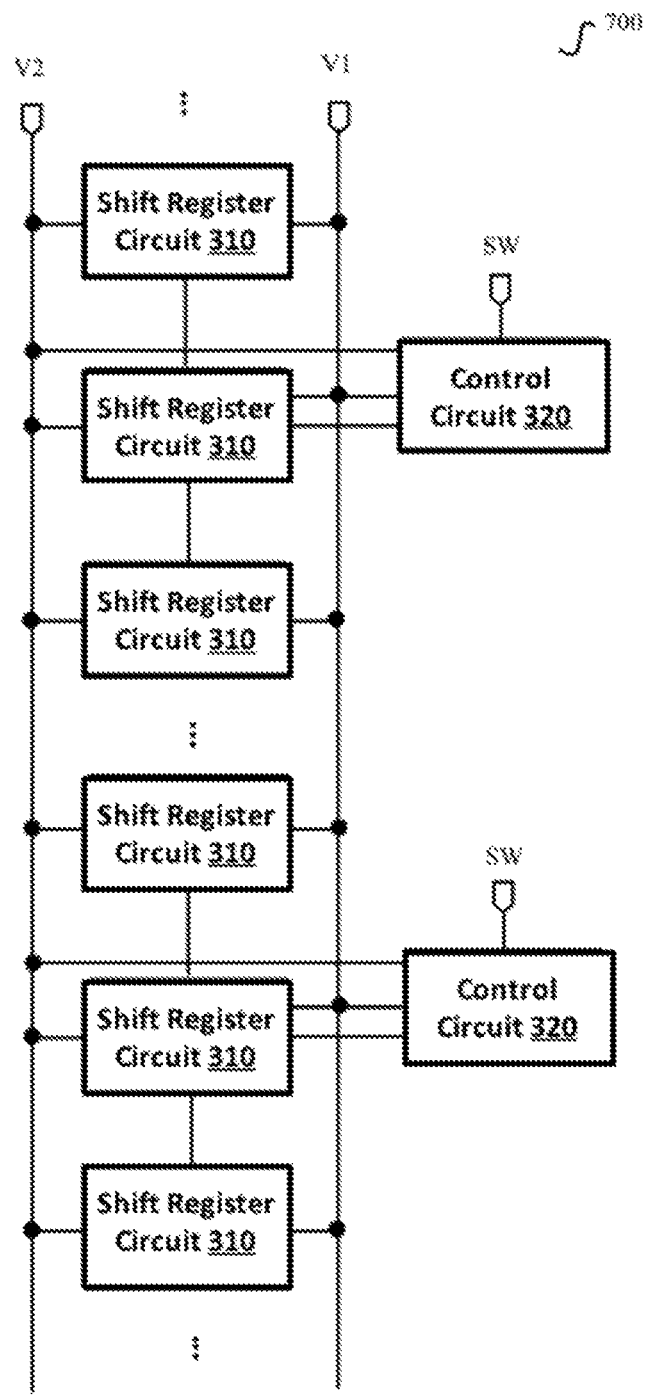
FIG. 10 illustrates a block diagram of a shift register according to some embodiments of the disclosure.

FIG. 10 illustrates a block diagram of a shift register according to some embodiments of the disclosure. The shift register 700 includes a plurality of shift register circuits 310 that are cascadedly connected. The cascaded connection of the plurality of shift register circuits 310 is in a conventional way, and thus will not be described here in detail.

In the shift register described herein, a shift register circuit 310 at a predetermined stage is electrically coupled with a control circuit 320 to thereby form a shift register unit, such that the voltage at the pull-up node PU_n in the shift register circuit 310 at this particular stage can be maintained by the control circuit 320. The position of the shift register circuit 310 that is coupled with the control circuit 320 is related to the relationship between the touch control signal and the scanning signal.

For example, if a touch control signal occurs in a time period before a scanning signal of line n to be outputted from the signal output terminal OUT_n is generated and after a scanning signal of line n−1 to be outputted from the signal output terminal OUT_n−1 is generated, the shift register unit 300 (i.e. comprising a shift register circuit 310 and a corresponding control circuit 320, which couples, and thus controls, the shift register circuit 310) is located at the $n^{th}$ stage of the shift register 700. Here, n is a natural number (i.e. an integer more than one).

In a fourth aspect, a method for driving a shift register is also provided. Herein the shift register 700 according to any one the embodiments as described above.

Specifically, the driving method comprises: providing a first control signal to the first control terminal SW before a shift register circuit 310 at a predetermined stage outputs a scanning signal from a signal output terminal OUT_n and after a shift register circuit 310 at an immediate upper stage outputs a scanning signal from a signal output terminal OUT_n−1 to thereby control a control circuit 320 coupled with the shift register circuit 310 at the predetermined stage.

Herein, the control circuit 320 can alternately output a hold signal to the pull-up node PU_n in the shift register circuit 310 by means of a first AC signal and a second AC signal respectively from a first AC signal terminal V1 and a second AC signal terminal V2 that are coupled to the control circuit 320.

In a fifth aspect, the present disclosure further provides a display apparatus 800.

Figure 11:
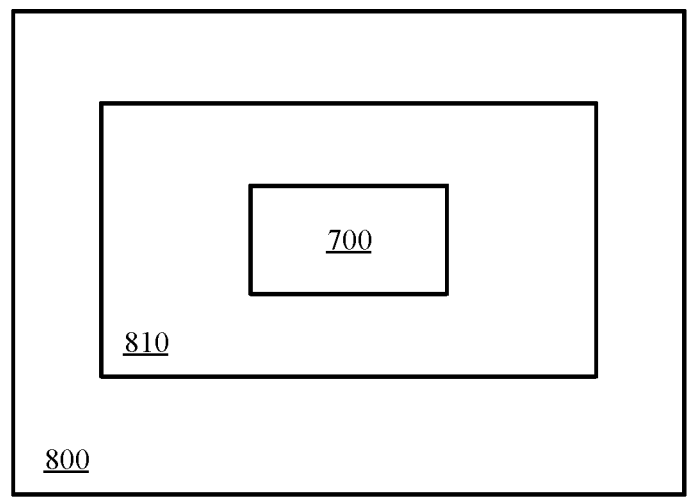
FIG. 11 illustrates a block diagram of a display apparatus according to some embodiments of the disclosure.

FIG. 11 illustrates a block diagram of a display apparatus according to some embodiments of the disclosure. As shown in the figure, the display apparatus includes an array substrate 810, which further comprises a shift register 700 according to any one the embodiments described above and illustrated in FIG. 10.

Herein, the display apparatus can be any electronics products with display functions, such as electronic papers, mobile phones, tablet computers, TV, notebook computers, digital photo frames, wearable devices, or navigators, etc.

Although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation to encompass such modifications and equivalent structures.

The invention claimed is:

1. A shift register unit, comprising:
a shift register circuit; and
a control circuit, electrically coupled to the shift register circuit and at least one control terminal;
wherein:
the control circuit is configured, based on at least one control signal respectively from the at least one control terminal, to output a hold signal to a pull-up node in the shift register circuit such that a high voltage maintains at the pull-up node during a specified time period;
the at least one control terminal comprises a first control terminal, a second control terminal and a third control terminal, wherein the control circuit comprises a first transistor, a second transistor, and a third transistor;
a control electrode and a first electrode of the first transistor are both electrically connected to the second control terminal;
a second electrode of the first transistor is electrically connected to a first electrode of the second transistor;
a control electrode of the second transistor is electrically connected to the first control terminal;
a second electrode of the second transistor is electrically connected to the pull-up node;
a control electrode and a first electrode of the third transistor are electrically connected with the third control terminal; and
a second electrode of the third transistor is electrically connected to the first electrode of the second transistor.

2. The shift register unit of claim 1, wherein at least one of the second control terminal and the third control terminal is not coupled to the shift register circuit.

3. The shift register unit of claim 1, wherein each of the second control terminal and the third control terminal is coupled to the shift register circuit.

4. The shift register unit of claim 3, wherein the shift register circuit is configured to alternately control a voltage at each of at least one pull-down node based on a second control signal from the second control terminal and a third control signal from the third control terminal.

5. The shift register unit of claim 3, wherein:
each of the second control signal and the third control signal is an AC signal, and
the second control signal and the third second control signal are opposite to each other.

6. The shift register unit of claim 1, wherein the control circuit is electrically coupled to a first control terminal and a second control terminal, wherein the control circuit comprises an eighth transistor and a ninth transistor, wherein:
a control electrode and a first electrode of the eighth transistor are both electrically connected to the second control terminal;
a second electrode of the eighth transistor is electrically connected to a first electrode of the ninth transistor;
a control electrode of the ninth transistor is electrically connected to the first control terminal; and
a second electrode of the ninth transistor is electrically connected to the pull-up node.

7. The shift register unit of claim 1, wherein the control circuit is electrically coupled to a first control terminal, wherein the control circuit comprises a tenth transistor, wherein:
a control electrode and a first electrode of the tenth transistor are both electrically connected to the first control terminal; and
a second electrode of the tenth transistor is electrically connected to the pull-up node.

8. A display apparatus, comprising an array substrate having a shift register including a plurality of shift register circuits cascadedly connected in stages, wherein:
the plurality of shift register circuits comprise a first shift register circuit, coupled with a control circuit to thereby form a shift register unit according to claim 1.

9. The display apparatus of claim 8, wherein each of the plurality of shift register circuits is coupled with a control circuit to form a shift register unit.

10. The display apparatus of claim 8, wherein the display apparatus has a touch control functionality independent from a display functionality, wherein:
the specified time period is a time period for touch control signals.

11. A shift register unit, comprising:
a shift register circuit; and
a control circuit, electrically coupled to the shift register circuit and at least one control terminal;
wherein:
the control circuit is configured, based on at least one control signal respectively from the at least one control terminal, to output a hold signal to a pull-up node in the shift register circuit such that a high voltage maintains at the pull-up node during a specified time period;
wherein the control circuit is electrically coupled to a first control terminal, a second control terminal and a third control terminal, wherein the control circuit comprises a fourth transistor, a fifth transistor, a sixth transistor and a seventh transistor, wherein:
a control electrode and a first electrode of the fourth transistor are both electrically connected to the second control terminal;
a second electrode of the fourth transistor is electrically connected to a first electrode of the fifth transistor;
a control electrode of the fifth transistor is electrically connected to the first control terminal;
a second electrode of the fifth transistor is electrically connected to the pull-up node;
a control electrode and a first electrode of the sixth transistor are both electrically connected with the third control terminal;
a second electrode of the sixth transistor is electrically connected with a first electrode of the seventh transistor;
a control electrode of the seventh transistor is coupled to the first control terminal; and
a second electrode of the seventh transistor is electrically connected to the pull-up node.

12. A method for driving a shift register unit, wherein the shift register unit comprises a shift register circuit and a control circuit, wherein the control circuit is electrically coupled to the shift register circuit and at least one control terminal, and is configured, based on at least one control signal respectively from the at least one control terminal, to output a hold signal to a pull-up node in the shift register circuit such that a high voltage maintains at the pull-up node during a specified time period, the method comprising:
providing the at least one control signal respectively to the at least one control terminal in the shift register unit such that the control circuit outputs the hold signal to the pull-up node in the first shift register circuit in the shift register unit during a specified time period;
wherein the control circuit is electrically coupled to a first control terminal, a second control terminal and a third control terminal, wherein the control circuit comprises a fourth transistor, a fifth transistor, a sixth transistor and a seventh transistor, wherein:
a control electrode and a first electrode of the fourth transistor are both electrically connected to the second control terminal;
a second electrode of the fourth transistor is electrically connected to a first electrode of the fifth transistor;
a control electrode of the fifth transistor is electrically connected to the first control terminal;
a second electrode of the fifth transistor is electrically connected to the pull-up node;
a control electrode and a first electrode of the sixth transistor are both electrically connected with the third control terminal;
a second electrode of the sixth transistor is electrically connected with a first electrode of the seventh transistor;
a control electrode of the seventh transistor is coupled to the first control terminal; and
a second electrode of the seventh transistor is electrically connected to the pull-up node.

13. The method according to claim 12, wherein the specified time period is before the first shift register circuit outputs a first scanning signal and after a shift register circuit at a stage immediately upstream of the first shift register circuit outputs a second scanning signal.

14. The method according to claim 12, wherein the providing the at least one control signal respectively to the at least one control terminal in the shift register unit comprises:
- providing a high-voltage first control signal, a second control signal, and a third control signal respectively to the first control terminal, the second control terminal and the third control terminal.

15. The method according to claim 12, wherein the providing the at least one control signal respectively to the at least one control terminal in the shift register unit comprises:
- providing a high-voltage first control signal to the first control terminal.

16. The method according to claim 12, wherein the providing the at least one control signal respectively to the at least one control terminal in the shift register unit comprises:
- providing a high-voltage first control signal and a high-voltage second control signal respectively to the first control terminal and the second control terminal.

\* \* \* \* \*